(12) United States Patent
Roeth et al.

(10) Patent No.: US 11,393,714 B2
(45) Date of Patent: Jul. 19, 2022

(54) PRODUCING A BURIED CAVITY IN A SEMICONDUCTOR SUBSTRATE (71) Applicant: Infineon Technologies AG, Neubiberg (DE)

(72) Inventors: Andre Roeth, Dresden (DE); Boris Binder, Dresden (DE); Thoralf Kautzsch, Dresden (DE); Uwe Rudolph, Dresden (DE); Maik Stegemann, Freital (DE); Mirko Vogt, Dresden (DE)

(73) Assignee: Infineon Technologies AG, Neubiberg (DE)

(*) Notice: Subject to any disclaimer, the term of this patent is extended or adjusted under 35 U.S.C. 154(b) by 174 days.

(21) Appl. No.: 16/922,711

(22) Filed: Jul. 7, 2020

(65) Prior Publication Data
US 2021/0013087 A1 Jan. 14, 2021

(30) Foreign Application Priority Data
Jul. 11, 2019 (DE) .......................... 102019210285.9

(51) Int. Cl.
H01L 21/764 (2006.01)
H01L 21/3065 (2006.01)

(52) U.S. Cl.
CPC ........ *H01L 21/764* (2013.01); *H01L 21/3065* (2013.01)

(58) Field of Classification Search
None
See application file for complete search history.

(56) References Cited

U.S. PATENT DOCUMENTS

| 2015/0076594 | A1  | 3/2015 | Hsieh |
| 2016/0155734 | A1  | 6/2016 | Gogoi |
| 2019/0027471 | A1  | 1/2019 | Balakrishnan et al. |
| 2021/0013087 | A1* | 1/2021 | Roeth ................... H01L 21/764 |

FOREIGN PATENT DOCUMENTS

| DE | 11 2004 002 608 T5 | 11/2006 |
| DE | 10 2015 114 796 A1 | 3/2016 |

* cited by examiner

Primary Examiner — Jack S Chen
(74) Attorney, Agent, or Firm — Harrity & Harrity, LLP (57) ABSTRACT In a method for producing a buried cavity in a semiconductor substrate, trenches are produced in a surface of a semiconductor substrate down to a depth that is greater than cross-sectional dimensions of the respective trench in a cross section perpendicular to the depth, wherein a protective layer is formed on sidewalls of the trenches. Isotropic etching through bottom regions of the trenches is carried out. After carrying out the isotropic etching, the enlarged trenches are closed by applying a semiconductor epitaxial layer to the surface of the semiconductor substrate.

14 Claims, 6 Drawing Sheets

PRODUCING A BURIED CAVITY IN A SEMICONDUCTOR SUBSTRATE

CROSS REFERENCE TO RELATED APPLICATION

This application claims priority to German Patent Application No. 102019210285.9 filed on Jul. 11, 2019, the content of which is incorporated by reference herein in its entirety.

TECHNICAL FIELD

The present disclosure relates to methods for producing buried cavities in semiconductor substrates. Examples relate to methods for producing buried cavities which make it possible to produce microstructures for a variety of applications.

BACKGROUND

Methods are known for producing buried cavities in a silicon substrate which make it possible to produce microstructures for a variety of applications. Methods known as silicon-on-nothing technology, SON technology, or the Venezia process use a process sequence which involves firstly producing a trench array of trenches in a silicon substrate, whereupon a thermal treatment is carried out at high temperatures of more than 1000° C. The thermal treatment initiates a silicon morphological transformation process in which, from the structured trench array, a buried cavity is produced below a silicon layer, this sometimes being referred to as silicon-on-nothing. This silicon layer above the cavity can be used for diverse applications. By way of example, the silicon layer can be used for producing MEMS devices, MEMS=microelectromechanical system. In examples, the silicon layer can form a movable membrane of a pressure sensor or of a loudspeaker. In examples, the layer can be used as a seismic mass, suspended from a spring construction, for acceleration sensors or as a stress decoupling structure for pressure sensors. Such methods make it possible to attain cavity heights of approximately 0.5 to 1.5 μm.

OVERVIEW

Methods described herein make it possible to produce cavities with a greater cavity height than prior methods.

Examples of the present disclosure provide a method for producing a buried cavity in a semiconductor substrate, having the following features:
producing trenches in a surface of a semiconductor substrate down to a depth that is greater than cross-sectional dimensions of the respective trench in a cross section perpendicular to the depth, wherein a protective layer is formed on sidewalls of the trenches;
carrying out isotropic etching through bottom regions of the trenches in order to produce enlarged trenches, wherein the enlarged trenches each have an increased depth and increased cross-sectional dimensions;
after carrying out the isotropic etching, closing the enlarged trenches by applying a semiconductor epitaxial layer to the surface of the semiconductor substrate,
wherein a closed continuous cavity is formed in the semiconductor substrate by virtue of the fact that when carrying out the isotropic etching, the cross-sectional dimensions of the enlarged trenches are enlarged further in such a way that adjacent trenches touch one another and a continuous cavity arises, and/or after closing the enlarged trenches, a thermal treatment is carried out, using which cross-sectional dimensions of adjacent trenches are enlarged, such that they touch one another and a continuous closed cavity arises.

In examples of the present disclosure, therefore, producing deep trenches in a surface of a semiconductor substrate is followed by carrying out isotropic etching of the bottom regions of the trenches in order to increase the depth and width of the trenches. In examples, the cross-sectional dimensions, the width, of the trenches can already be enlarged by this means in such a way that adjacent trenches touch one another and a continuous cavity thus arises. In other examples, the cross-sectional dimensions of at least some of the trenches are not increased during the isotropic etching in such a way that they touch one another, with the result that no continuous cavity is produced for such trenches during the isotropic etching. In such other examples, a thermal treatment is subsequently carried out, using which a process of morphological transformation of the semiconductor material can take place, in order thereby to produce the continuous closed cavity. By virtue of the isotropic etching after producing the deep trenches, methods in accordance with the present disclosure make it possible to produce buried cavities with an enlarged cavity height.

BRIEF DESCRIPTION OF THE DRAWINGS

Examples of the disclosure are described below with reference to the accompanying drawings, in which.

DETAILED DESCRIPTION

Hereinafter, examples of the present disclosure are described in detail and using the accompanying drawings. It should be pointed out that identical elements or elements having the same functionality may be provided with identical or similar reference signs, a repeated description of elements provided with the same or a similar reference sign typically being omitted. Descriptions of elements having identical or similar reference signs are mutually interchangeable. Many details are described in the following description in order to provide a more thorough explanation of examples of the disclosure. However, it is obvious to those skilled in the art that other examples can be implemented without these specific details. Features of the various examples described can be combined with one another, unless features of a corresponding combination are mutually exclusive or such a combination is expressly excluded.

Referring to FIGS. 1A to 1F, firstly a first variant of the present disclosure will be explained.

Figure 1A:
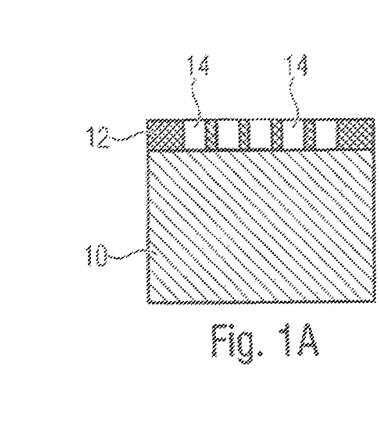
FIGS. 1A to 1F show schematic cross-sectional illustrations of a semiconductor substrate for elucidating a first variant of the present disclosure, wherein a continuous cavity is produced using isotropic etching.
Figure 1B:
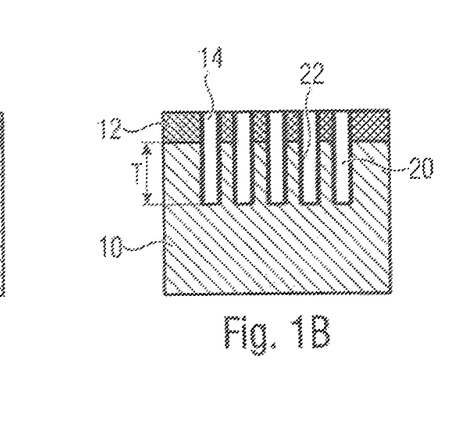

Firstly a hard mask is applied on a surface of a semiconductor substrate 10 and structured in order to produce a structured hard mask 12. The semiconductor substrate can consist of silicon, such as e.g. monocrystalline silicon, or some other semiconductor material such as e.g. Ge or GaAs. Photolithographic processes can be used for structuring the hard mask 12. In regions below which trenches are intended to be produced in the semiconductor substrate 10, the structured hard mask 12 has holes 14 penetrating through the hard mask 12. The hard mask can comprise one or a plurality of layers composed of any suitable material, such as e.g. oxide, nitride, or a polymer material. In examples, the hard mask is formed by a hard mask stack. The resulting structure is shown in FIG. 1A.

Figure 3A:
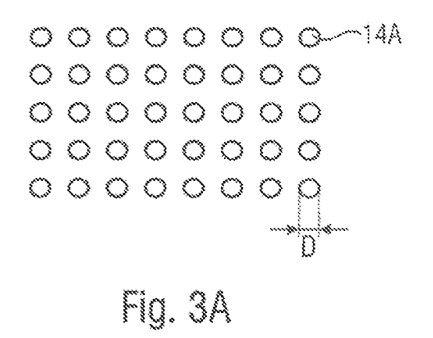
FIGS. 3A and 3B show patterns of openings in a hard mask in accordance with examples of the present disclosure.
Figure 3B:
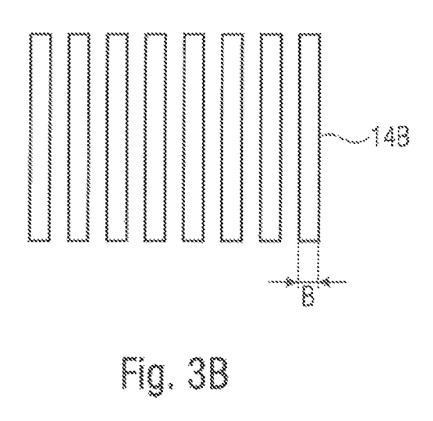

The holes 14 can be formed in a uniform or nonuniform pattern in the hard mask. The holes are formed in the hard mask in a pattern that corresponds to the pattern in which the trenches are intended to be formed in the semiconductor substrate. FIG. 3A shows for example a uniform grid of round openings 14A. FIG. 3B shows an arrangement of elongate openings 14B arranged with their long sides next to one another.

Through the holes 14, deep trenches 20 are then etched in the semiconductor substrate 10. The deep trenches 20 can be etched using anisotropic reactive ion etching. As a result, a trench array is produced in the semiconductor substrate 10. The trenches 20 can attain a depth T of approximately 2 to 10 µm. Cross-sectional dimensions of the trenches produced using the anisotropic etching in a cross section perpendicular to the depth T substantially correspond to cross-sectional dimensions of the holes 14. In this case, a deep trench is understood herein to mean a trench whose depth is greater than its cross-sectional dimensions. In the case of the round holes 14A, the depth of the trenches is greater than the diameter D. In the case of the elongate holes 14B, the depth T is greater than the width B.

The reactive ion etching can be carried out step-by-step or continuously. As in shown in FIG. 1B, a protective layer 22, which can also be referred to as a passivation layer, is formed on sidewalls of the trenches 20 during the reactive ion etching. Depending on the etching method used, the protective layer 22 can consist of oxide or a polymer. The protective layer 22 is left on the sidewalls of the trenches 20 and protects the sidewalls of the trenches 20 during subsequent isotropic etching.

Figure 1C:
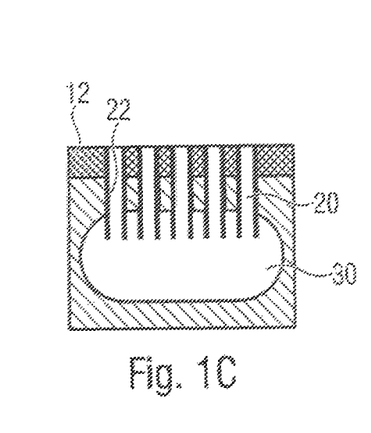

Parts of the protective layer that are possibly situated on bottom regions of the trenches 20 are removed, such that isotropic etching through the bottom regions of the trenches 20 can take place. Enlarged trenches are produced as a result of the isotropic etching, wherein the enlarged trenches each have an increased depth and increased cross-sectional dimensions compared with the trenches produced by the anisotropic etching. During the isotropic etching, the protective layer 22 protects the sidewalls of the trenches in order to prevent widening in the open regions of the trenches 20 facing the surface of the semiconductor substrate 10. The isotropic etching can be carried out in wet-chemical or dry fashion. The isotropic etching has the task of removing as much semiconductor volume as possible in the trenches. If the distance between the trenches in the trench array is sufficiently small, then a lattice arises at the surface of the semiconductor substrate, below which lattice a continuous cavity 30 has formed, as is shown in FIG. 1C. If the semiconductor substrate consists of silicon, the lattice can be a monocrystalline silicon lattice.

Figures 1D, 1E, 1F:
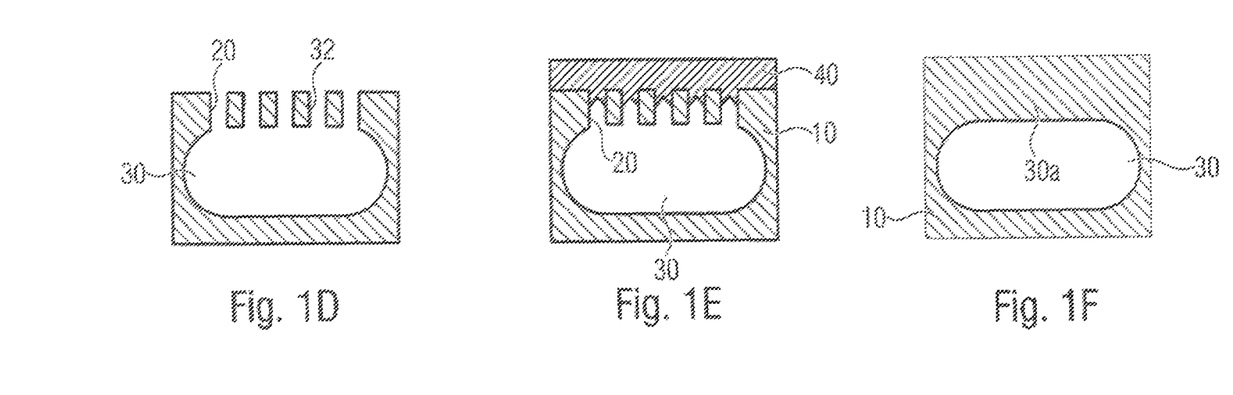

Producing the continuous cavity 30 is followed by removing the protective layer 22 on the sidewalls of the trenches 20. This can be done using a wet-chemical etching process, for example. Furthermore, the hard mask 12 is removed. The resulting structure, in which a semiconductor lattice 32 has been formed above the continuous cavity 30, is shown in FIG. 1D.

Figure 4A:
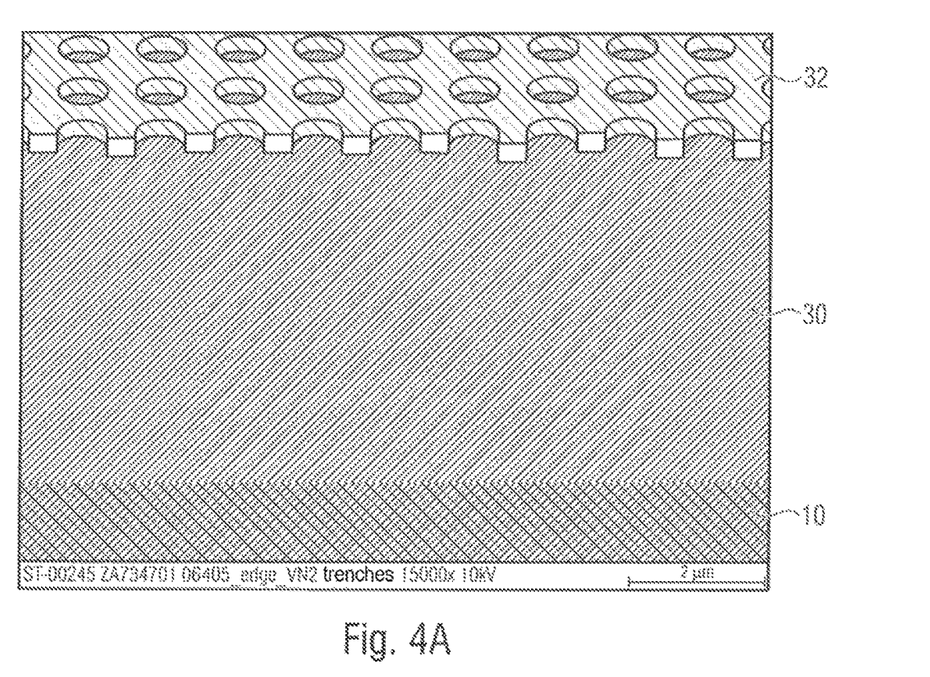
FIGS. 4A and 4B show schematic illustrations of a semiconductor lattice formed over a continuous cavity.
Figure 4B:
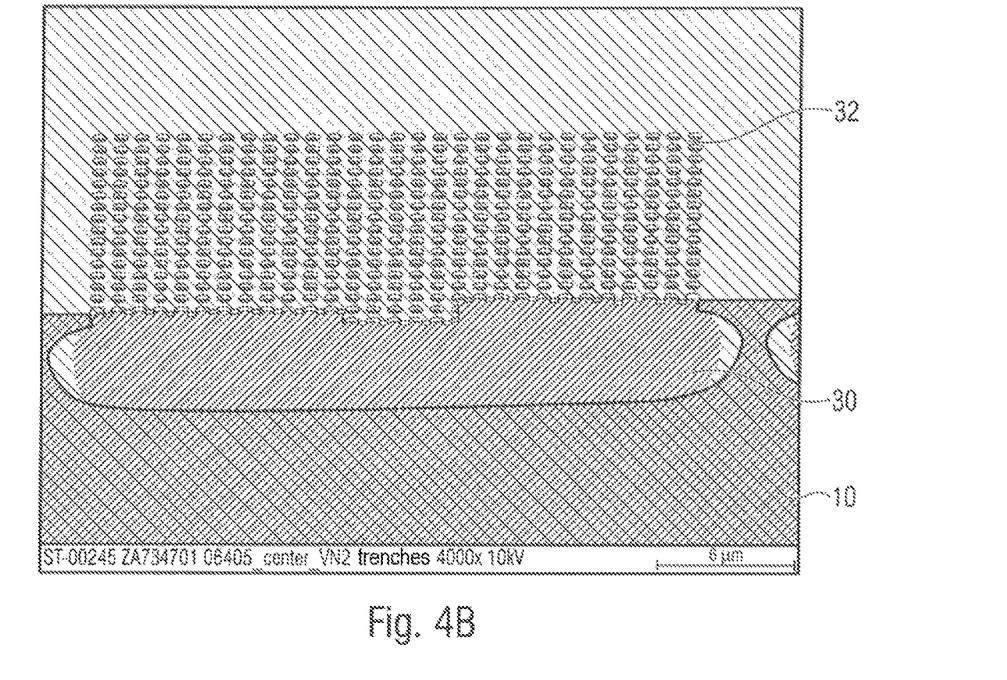

FIGS. 4A and 4B show isometric cross-sectional illustrations of the semiconductor lattice 32 formed above the continuous cavity 30 in the semiconductor substrate 10, wherein FIG. 4A shows an enlarged cross-sectional illustration of an excerpt from FIG. 4B, which is likewise an isometric cross-sectional illustration.

Afterward, a semiconductor epitaxial layer 40 is applied, for example grown, onto that surface of the semiconductor substrate 10 in which the trenches 20 are formed. The semiconductor epitaxial layer 40 can be for example a monocrystalline silicon layer that is deposited on the surface of a monocrystalline silicon substrate. In this case, the cross-sectional dimensions of the trenches 20 are such that the latter are closed during the deposition of the epitaxial layer before semiconductor material passes into the cavity 30 to a significant extent or at all. The resulting structure is shown in FIG. 1E.

In examples of the present disclosure, the method for producing a closed cavity can end after applying the semiconductor epitaxial layer 40. In other examples, applying the semiconductor epitaxial layer 40 can be followed by a thermal treatment resulting in a morphological transformation of the semiconductor material, such that straightening of a wall 30a of the buried cavity 30 facing the surface of the semiconductor substrate 10 takes place, as is shown in FIG. 1F. FIGS. 1E and 1F thus each show a buried cavity produced in a semiconductor substrate 10, 40.

Figure 2A:
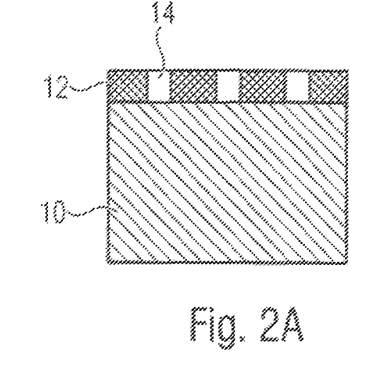
FIGS. 2A to 2F show schematic cross-sectional illustrations of a semiconductor substrate for elucidating a second variant of the present disclosure, wherein a continuous cavity is produced using isotropic etching and a thermal treatment.
Figure 2B:
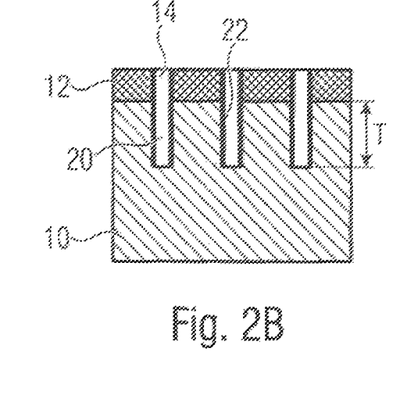
Figure 2C:
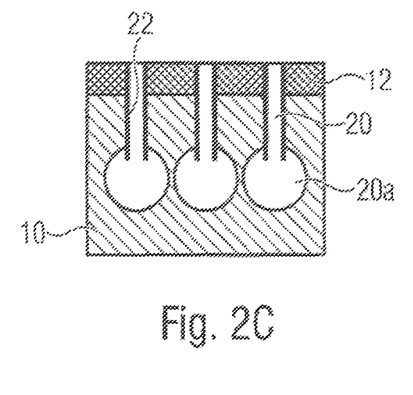
Figure 2D:
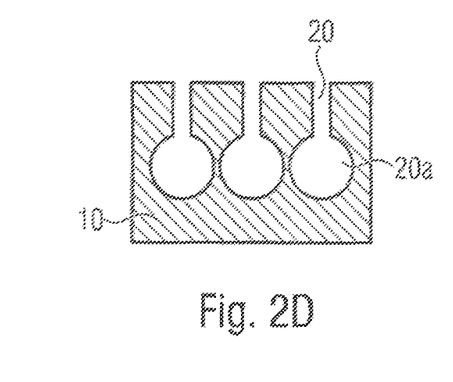
Figures 2E, 2F:
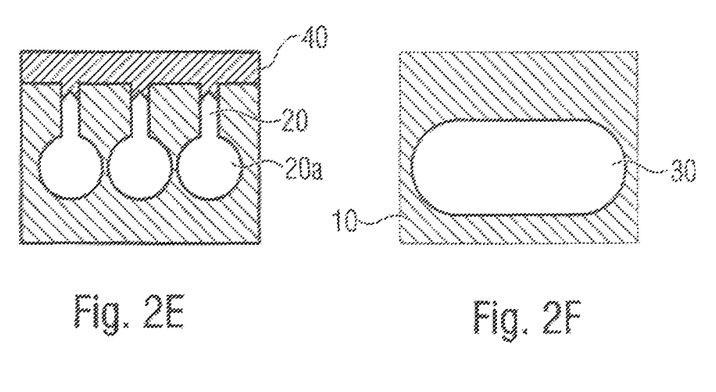

Referring to FIGS. 2A to 2F, a second variant of the present disclosure will now be explained. FIG. 2A once again shows a semiconductor substrate 10 with a structured type of hard mask 12 formed thereon, the mask layer once again having openings 14 corresponding to deep trenches to be produced in the semiconductor substrate 10. FIG. 2B once again shows the semiconductor substrate 10 with the deep trenches 20 produced therein by anisotropic etching. The trenches can once again be produced in the manner as explained above with reference to FIGS. 1A and 1B. Afterward, isotropic etching once again takes place in order to produce enlarged trenches 20a, wherein the enlarged trenches 20a each have an increased depth and increased cross-sectional dimensions. In this variant, however, the anisotropic etching takes place in such a way that adjacent trenches do not touch one another, with the result that after the isotropic etching a continuous cavity has not yet been formed, as is shown in FIG. 2C. Subsequently, the protective layer 22 and the hard mask 12 are once again removed, the resulting structure being shown in FIG. 2D. Subsequently, a semiconductor epitaxial layer 40 is once again applied, as is shown in FIG. 2E. In this case, the dimensions of the trenches 20 are once again such that the latter are closed during the application of the semiconductor epitaxial layer 40 before semiconductor material can pass into the enlarged trenches 20a to a significant extent or at all. Closing the enlarged trenches using the semiconductor epitaxial layer 40 is followed by a thermal treatment that results in cross-sectional dimensions of adjacent trenches 20a being enlarged, such that they touch one another and a continuous closed cavity 30 arises, as is shown in FIG. 2F. A morphological transformation process takes place during the thermal treatment, as a result of which process the semiconductor material flows in an H atmosphere, for example, and the continuous closed cavity 30 is produced.

In the first variant described above, therefore, when carrying out the isotropic etching, the cross-sectional dimensions of the enlarged trenches are enlarged further in such a way that adjacent trenches touch one another and a continuous cavity arises. In the second variant described above, the isotropic etching is carried out in such a way that at least some of the adjacent enlarged trenches 20a do not touch one another, whereupon after closing the enlarged trenches with the semiconductor epitaxial layer, a thermal treatment is carried out, using which cross-sectional dimensions of adjacent trenches are enlarged, such that they touch one another and a continuous closed cavity arises.

The question of whether the enlarged adjacent trenches touch one another after the isotropic etching depends, in particular, on the distances between the trenches in the trench array. One important parameter that influences whether or not such touching occurs is the duration of the isotropic etching. In examples of the present disclosure, mutually facing edges of respectively adjacent trenches can be at a distance in a range of 200 nm to 2 µm, preferably in a range of 200 nm to 1 µm. With a smaller distance there is the risk that the semiconductor material remaining above the enlarged trench regions, for example the remaining lattice structure, will no longer have sufficient stability. With a larger distance there is the risk that a continuous cavity will no longer be able to be formed using the isotropic etching and an optional thermal treatment following that. Larger distances in the specified range can have the effect that enlarged adjacent trenches produced by the isotropic etching no longer touch one another and are thus not connected after the isotropic etching in order to produce a continuous large cavity. With smaller distances, such production of a continuous cavity can take place. Irrespective of whether or not such a continuous cavity is produced by the isotropic etching, the isotropic etching is followed by the process for closing the semiconductor lattice or the perpendicular trenches using an epitaxial layer deposition at the substrate surface. If the trenches do not touch one another after the isotropic etching, applying or growing the semiconductor epitaxial layer is followed by a thermal treatment in order to produce the continuous cavity.

During the epitaxial layer deposition, little or no material is intended to pass into the cavities produced by the isotropic etching and the process times are intended to be able to be kept short. This can be ensured using smallest possible cross-sectional dimensions of the superficial trench geometry. The smaller the cross-sectional dimensions of the trenches, the better the latter are able to be closed, but the subsequent isotropic etching is adversely affected by small cross-sectional dimensions of the trenches. In examples, the trenches can be produced with cross-sectional dimensions in a range of less than 1 µm, preferably in a range of 100 nm to 900 nm, in a range of 400 nm to 800 nm or in a range of 100 nm to 400 nm in at least one direction. In the case of round trenches, the cross-sectional dimension can be the diameter, for example. In the case of a square trench cross section, the cross-sectional dimension can be the side length. In the case of rectangular trench cross sections, the cross-sectional dimension can be the width B of the trenches. In examples of the present disclosure, it is therefore not necessary to form a prevention layer for preventing an epitaxial layer growth after carrying out the isotropic etching and before applying the semiconductor epitaxial layer on surfaces of the trenches.

As has been explained, for trench arrays with small trench distances, a buried cavity having a large cavity height can already be produced by the epitaxial overgrowth. Consequently, in examples of the present disclosure, a subsequent thermal treatment is not absolutely necessary, for example if a smooth upper cavity wall is not necessary for the subsequent use. However, an additional rounding of the sidewalls of the buried cavity and a planarization of the upper cavity wall can be achieved using a subsequent thermal treatment. Consequently, examples of the present disclosure make it possible to produce a large cavity even without a morphological transformation process at high temperatures, which can lead to considerable cost advantages. Furthermore, the occurrence of a step at the edge of the cavity, such as is usually brought about as a result of such a morphological transformation process, can be avoided or at least significantly reduced.

As a result of the trench array being overgrown with a semiconductor epitaxial layer, for example a silicon epitaxial layer, the process conditions prevailing during this overgrowth, for example a pressure of 0.013 bar and a hydrogen atmosphere, can be enclosed into the trenches. If a thermal treatment is intended to be carried out, it can then take place in a batch furnace at a temperature of approximately 1150° C. and atmospheric pressure for approximately 60 minutes. If the thermal treatment is intended to serve only for rounding the sidewalls, then it can be significantly shorter. During this thermal treatment, flowing of the semiconductor material, such as the silicon, for example, can then take place as in a customary SON process. Even if the trenches in the trench array are not intended to be connected after the isotropic etching since larger trench distances were chosen, a large cavity can be produced using such a thermal treatment in the batch furnace. In examples of the present disclosure, both process variants described can be used depending on the field of application.

Figure 5:
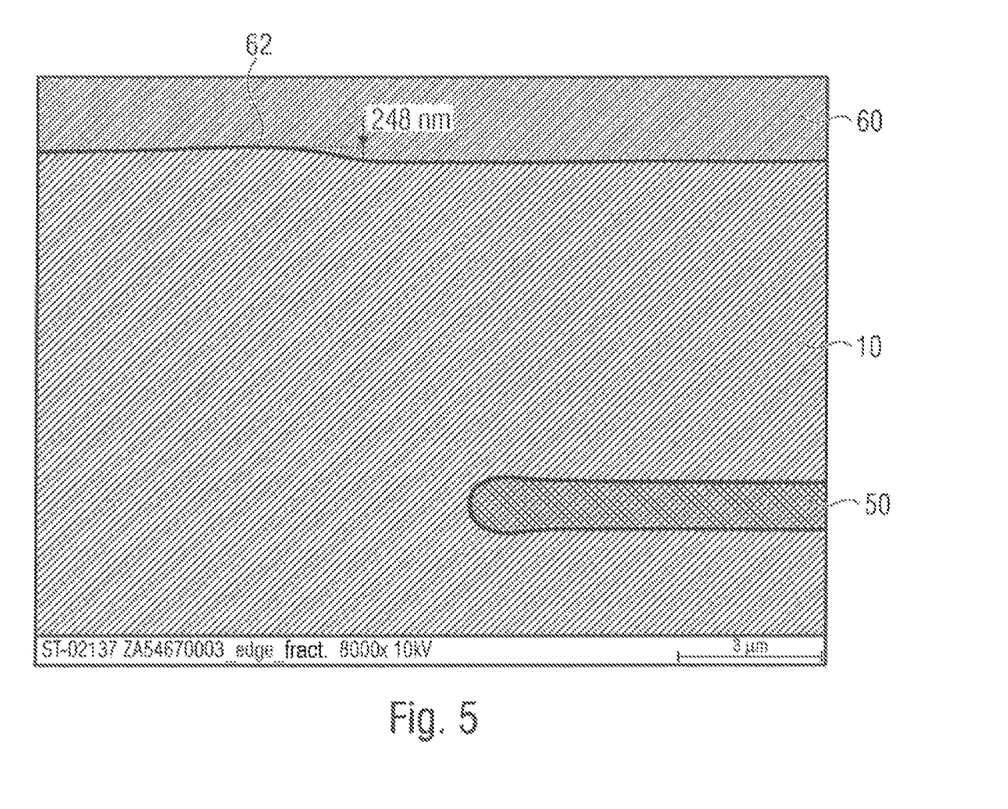
FIG. 5 shows a schematic cross-sectional illustration of a cavity with a step in the substrate surface.

As has been described above, in accordance with the first variant with the epitaxial overgrowth of a semiconductor hole lattice it is possible to produce a large cavity in a substrate. Given a suitable choice of the diameter of the trenches to be etched, which should be as small as possible, for example in a range of 100 to 400 nm, a cavity can subsequently be produced without a morphological transformation process at high temperatures. This firstly has significant advantages with regard to the costs incurred, since a further thermal treatment need not necessarily follow. In contrast to a conventional SON process, however, a step of a typical order of magnitude of 250 to 600 nm does not arise either. FIG. 5 shows a cavity 50 formed by an SON process in a semiconductor substrate 10. CMOS structures 60, for example, can be formed on the surface of the substrate. As is shown in FIG. 5, such a step 62 that is typical of an SON process exists at the edge of the cavity 50 in the surface of the semiconductor substrate 10. Such a step can be avoided in examples of the present disclosure.

In all applications in which an SON process is intended to be used for producing a micromechanical component and a monolithic integration is subsequently striven for, the step 62 arising as a result of the SON process would have to be removed. Such removal could take place using leveling with a cleaning and polishing process sequence. However, this results in an additional outlay. Furthermore, the quality of the surface after leveling is possibly not good enough for a CMOS process and the surface roughness is too great. In accordance with examples of the present disclosure, a complete closure of a continuous cavity can be achieved by epitaxial overgrowth with monocrystalline material on the substrate surface by the small trenches that reach the substrate surface being closed by the semiconductor epitaxial layer. Examples of the present disclosure thus make it possible to close the substrate with a large cavity situated therebelow with a material corresponding to the material of the substrate and enable the monolithic integration of a micromechanical component with a CMOS process under cost-effective conditions. In examples, therefore, closing the trenches with the semiconductor epitaxial layer is not followed by a morphological transformation using a thermal treatment, such that after closing the trenches using the semiconductor epitaxial layer, no step or a step of less than 200 nm is present at the edges of the buried cavity.

In examples, the trenches are produced using reactive ion etching, wherein an oxide layer forms on walls of the trenches, wherein the oxide layer is removed in the bottom regions of the trenches when carrying out the isotropic etching. In examples, the trenches are produced using reactive ion etching, wherein between respective etching steps a polymer layer is applied to walls of the trenches, wherein the polymer layer is removed in the bottom regions of the trenches when carrying out the isotropic etching. Such methods are also referred to as Bosch etching processes.

In examples, the trenches are produced in a two-dimensional uniform pattern. In examples, the trenches are produced with a distance between adjacent trenches such that a semiconductor lattice is formed above a continuous cavity after the isotropic etching. In examples, the trenches can also be produced in a two-dimensional nonuniform pattern as long as distances present between adjacent trenches are such that continuous cavities can be produced in a manner as described herein. In examples, some adjacent trenches may touch one another after the isotropic etching, and others may not, wherein a thermal treatment as described can then be carried out in order that such trenches that do not touch one another are enlarged in such a way that they touch one another in order, even for such a case, to produce a continuous cavity for all of the trenches.

In examples, the depth of the trenches before carrying out the isotropic etching can be in a range of 2 to 10 μm. A continuous cavity with a significantly smaller height would then be produced using a customary SON process. Examples of the present disclosure enable larger cavity heights using the isotropic etching and using closing the trenches with a semiconductor epitaxial layer.

In examples of the present disclosure, the semiconductor epitaxial layer is a monocrystalline epitaxial layer consisting of the same material as the semiconductor substrate. In examples, the semiconductor material is silicon.

In examples of the present disclosure, the semiconductor epitaxial layer has a thickness in a range of 1 μm to 15 μm. A larger thickness can result in alignment marks being covered and alignment problems occurring. A smaller thickness can result in an excessively low stability. In examples, the height of the buried cavity in a direction perpendicular to the surface of the semiconductor substrate can be in a range of 2 to 8 μm. In examples, the cavity can have lateral dimensions of greater than or equal to 5 μm, greater than or equal to 30 μm or greater than or equal to 40 μm, in each case up to a maximum lateral extent of approximately 60 μm.

Examples of the present disclosure provide a method for producing a CMOS circuit, wherein the method comprises a method for producing a cavity as described herein. In this case, producing the buried cavity can be followed by a CMOS process in order to produce CMOS elements, such as e.g. CMOS transistors, in the semiconductor epitaxial layer. In examples, the CMOS process can directly follow the process of applying the semiconductor epitaxial layer, without a planarization.

Examples of the present disclosure thus provide a novel process flow for producing buried cavities having enlarged cavity heights. As a result, it is possible to realize cavity heights of more than 0.5-1.5 μm, such as have been able to be realized using previous silicon-on-nothing technologies. Consequently, examples of the present disclosure are also suitable in particular for applications in which a higher underside freedom of movement of structures, for example sensor structures, arranged above the cavity is desired. Using the enlargement of the cavity height, it is thereby possible to obtain a larger signal swing in a component-specific manner, for example for acceleration sensors or IR emitters for optical applications. In examples, on account of the greater freedom of movement for an acceleration sensor structure it may be possible to reduce the used chip area according to the achievable cavity height.

In this case, examples of the present disclosure are based on a modified process in comparison with a standard method, although existing process sequences can be maintained in part and just a few steps are modified with little work expenditure. Examples of the present disclosure are suitable for diverse applications, for example MEMS structures, in which a movable layer or a movable element is arranged above the cavity. In examples, the layer formed above the cavity can be used as a seismic mass, suspended from a spring construction, for acceleration sensors or as a stress decoupling structure for pressure sensors.

Examples of the present disclosure relate to a method for producing a buried cavity in a semiconductor substrate. Examples relate to a method for producing a semiconductor substrate having a buried cavity, comprising a corresponding method for producing a buried cavity as described herein. Examples of the present disclosure relate to a method for producing a CMOS structure or a MEMS element, comprising a corresponding method for producing a semiconductor substrate.

Although some aspects of the present disclosure have been described as features in association with a method, it is clear that such a description can likewise be regarded as a description of corresponding device features. Although some aspects have been described as features in association with a device, it is clear that such a description can also be regarded as a description of corresponding features of a method.

In the detailed description above, in part different features have been grouped together in examples in order to rationalize the disclosure. This type of disclosure ought not to be interpreted as the intention that the claimed examples have more features than are expressly specified in each claim. Rather, as rendered by the following claims, the subject matter can reside in fewer than all the features of an individual example disclosed. The following claims are thus hereby incorporated in the detailed description, wherein each claim can represent a dedicated separate example. While each claim can represent a dedicated separate example, it should be noted that although dependent claims in the claims refer back to a specific combination with one or more other claims, other examples also encompass a combination of dependent claims with the subject matter of any other dependent claim or a combination of each feature with other dependent or independent claims. Such combinations shall be encompassed, unless it is explained that a specific combination is not intended. Furthermore, the intention is for a combination of features of a claim with any other independent claim also to be encompassed, even if this claim is not directly dependent on the independent claim.

The examples described above are merely illustrative of the principles of the present disclosure. It goes without saying that modifications and variations of the arrangements and of the details described are obvious to those skilled in the art. Therefore, the intention is for the disclosure to be limited only by the appended patent claims and not by the specific details set out for the purposes of the description and elucidation of the examples.

LIST OF REFERENCE SIGNS

10 Semiconductor substrate
12 Structured hard mask
14, 14A, 14B Openings
20 Trenches
20a Enlarged cavity
22 Protective layer
30 Cavity
30a Cavity top side
32 Semiconductor lattice
40 Semiconductor epitaxial layer
50 Cavity
60 CMOS structure

The invention claimed is:

1. A method, comprising:
producing trenches in a surface of a semiconductor substrate down to a depth that is greater than cross-sectional dimensions of a respective trench in a cross section perpendicular to the depth, wherein a protective layer is formed on sidewalls of the trenches;
carrying out isotropic etching through bottom regions of the trenches in order to produce enlarged trenches, wherein the enlarged trenches each have an increased depth and increased cross-sectional dimensions;
after carrying out the isotropic etching, closing the enlarged trenches by applying a semiconductor epitaxial layer to the surface of the semiconductor substrate, and
wherein a closed continuous cavity is formed in the semiconductor substrate by at least one of:
when carrying out the isotropic etching, the cross-sectional dimensions of the enlarged trenches are enlarged further in such a way that adjacent trenches touch one another and the closed continuous cavity arises, or
after closing the enlarged trenches, a thermal treatment is carried out, using which cross-sectional dimensions of adjacent trenches are enlarged, such that they touch one another and the closed continuous cavity arises.

2. The method as claimed in claim 1, wherein the trenches are produced with cross-sectional dimensions in a range of less than 1 μm.

3. The method as claimed in claim 1, wherein the trenches are produced such that mutually facing edges of respectively adjacent trenches are at a distance in a range of 200 nm to 2 μm, preferably in a range of 200 nm to 1 μm.

4. The method as claimed in claim 1, wherein the trenches are produced using reactive ion etching, wherein an oxide layer forms on walls of the trenches, wherein the oxide layer is removed in the bottom regions of the trenches when carrying out the isotropic etching.

5. The method as claimed in claim 1, wherein the trenches are produced using reactive ion etching, wherein between respective etching steps a polymer layer is applied to walls of the trenches, wherein the polymer layer is removed in the bottom regions of the trenches when carrying out the isotropic etching.

6. The method as claimed in claim 1, wherein the trenches are produced in a two-dimensional uniform or nonuniform pattern with a distance between adjacent trenches such that a semiconductor lattice is formed above a continuous cavity after the isotropic etching.

7. The method as claimed in claim 1, wherein at least one of:
closing the trenches with the semiconductor epitaxial layer is followed by the thermal treatment for a morphological transformation, wherein trenches that do not touch one another after carrying out the isotropic etching are connected to one another to form a continuous cavity, or
a straightening of a wall of the closed continuous cavity facing the surface of the semiconductor substrate takes place.

8. The method as claimed in claim 1, wherein closing the trenches with the semiconductor epitaxial layer is not followed by a morphological transformation using the thermal treatment, wherein after closing the trenches using the semiconductor epitaxial layer, no step or a step of less than 200 nm is present at edges of the closed continuous cavity.

9. The method as claimed in claim 1, wherein the depth of the trenches before carrying out the isotropic etching is in a range of 2 to 10 μm.

10. The method as claimed in claim 1, wherein the semiconductor epitaxial layer is a monocrystalline epitaxial layer.

11. The method as claimed in claim 1, wherein the semiconductor epitaxial layer is applied with a thickness in a range of 1 μm to 15 μm.

12. The method as claimed in claim 1, wherein a height of the closed continuous cavity in a direction perpendicular to the surface of the semiconductor substrate is in a range of 2 to 8 μm.

13. The method as claimed in claim 1, wherein no prevention layer for preventing an epitaxial layer growth is formed after carrying out the isotropic etching and before applying the semiconductor epitaxial layer on surfaces of the trenches.

14. A method for producing a CMOS circuit, wherein the method comprises a method as claimed in claim 1 and a CMOS process for producing CMOS transistors in the semiconductor epitaxial layer after producing the closed continuous cavity.

* * * * *